US 8,399,275 B2

(12) United States Patent
Akimoto et al.

(10) Patent No.: US 8,399,275 B2
(45) Date of Patent: Mar. 19, 2013

(54) METHOD FOR MANUFACTURING SEMICONDUCTOR LIGHT EMITTING DEVICE

(75) Inventors: Yosuke Akimoto, Kanagawa-ken (JP);
Akihiro Kojima, Kanagawa-ken (JP);
Miyuki Izuka, Kanagawa-ken (JP);
Yoshiaki Sugizaki, Kanagawa-ken (JP);
Hiroshi Koizumi, Kanagawa-ken (JP);
Tomomichi Naka, Kanagawa-ken (JP);
Yasuhide Okada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 13/153,554

(22) Filed: Jun. 6, 2011

(65) Prior Publication Data
US 2011/0300644 A1    Dec. 8, 2011

(30) Foreign Application Priority Data

Jun. 7, 2010  (JP) .................................. 2010-130426
May 19, 2011  (JP) .................................. 2011-112272

(51) Int. Cl.
*H01L 21/00* (2006.01)
(52) U.S. Cl. .................... 438/46; 438/16; 257/E21.529; 257/E21.53
(58) Field of Classification Search ................ 438/4, 16, 438/46; 257/E21.529, E21.53; 349/50
See application file for complete search history.

(56) References Cited

U.S. PATENT DOCUMENTS

| 2007/0262338 A1* | 11/2007 | Higashi et al. ................. 257/99 |
| 2008/0173884 A1* | 7/2008 | Chitnis et al. ................. 257/98 |
| 2010/0148198 A1 | 6/2010 | Sugizaki et al. |
| 2011/0233585 A1 | 9/2011 | Kojima et al. |
| 2011/0233586 A1 | 9/2011 | Kojima et al. |

FOREIGN PATENT DOCUMENTS

| JP | 2000-244012 | 9/2000 |
| JP | 2010-003753 | 1/2010 |

* cited by examiner

*Primary Examiner* — Caridad Everhart
(74) *Attorney, Agent, or Firm* — Turocy & Watson, LLP

(57) ABSTRACT

According to one embodiment, a method for manufacturing a semiconductor light emitting device is disclosed. The method can include forming a first interconnect layer, a second interconnect layer, a first metal pillar, a second metal pillar, a second insulating layer, a transparent material and a phosphor layer. The transparent material is formed on the first major surface of a semiconductor layer selected from the plurality of semiconductor layers on the basis of an emission spectrum of a light obtained from the first major surface side. The transparent material transmits the light. The phosphor layer is formed on the transparent material and the first major surface of the plurality of the semiconductor layers.

19 Claims, 11 Drawing Sheets

EMISSION WAVELENGTH OF BLUE LED

METHOD FOR MANUFACTURING SEMICONDUCTOR LIGHT EMITTING DEVICE

CROSS-REFERENCE TO RELATED APPLICATION

This application is based upon and claims the benefit of priority from Japanese Patent Application No. 2010-130426, filed on Jun. 7, 2010 and Japanese Patent Application No. 2011-112272, filed on May 19, 2011; the entire contents of which are incorporated herein by reference.

FIELD

Embodiments described herein relate generally to a method for manufacturing a semiconductor light emitting device.

BACKGROUND

A semiconductor light emitting device which includes a light emitting diode (LED) and a phosphor layer, is well known as a white light emitter. A color (wavelength) of light emitted externally depends on an emission wavelength of a light emitting layer, a kind of a phosphor layer and a thickness of the phosphor layer or the like.

DETAILED DESCRIPTION

Figure 1:
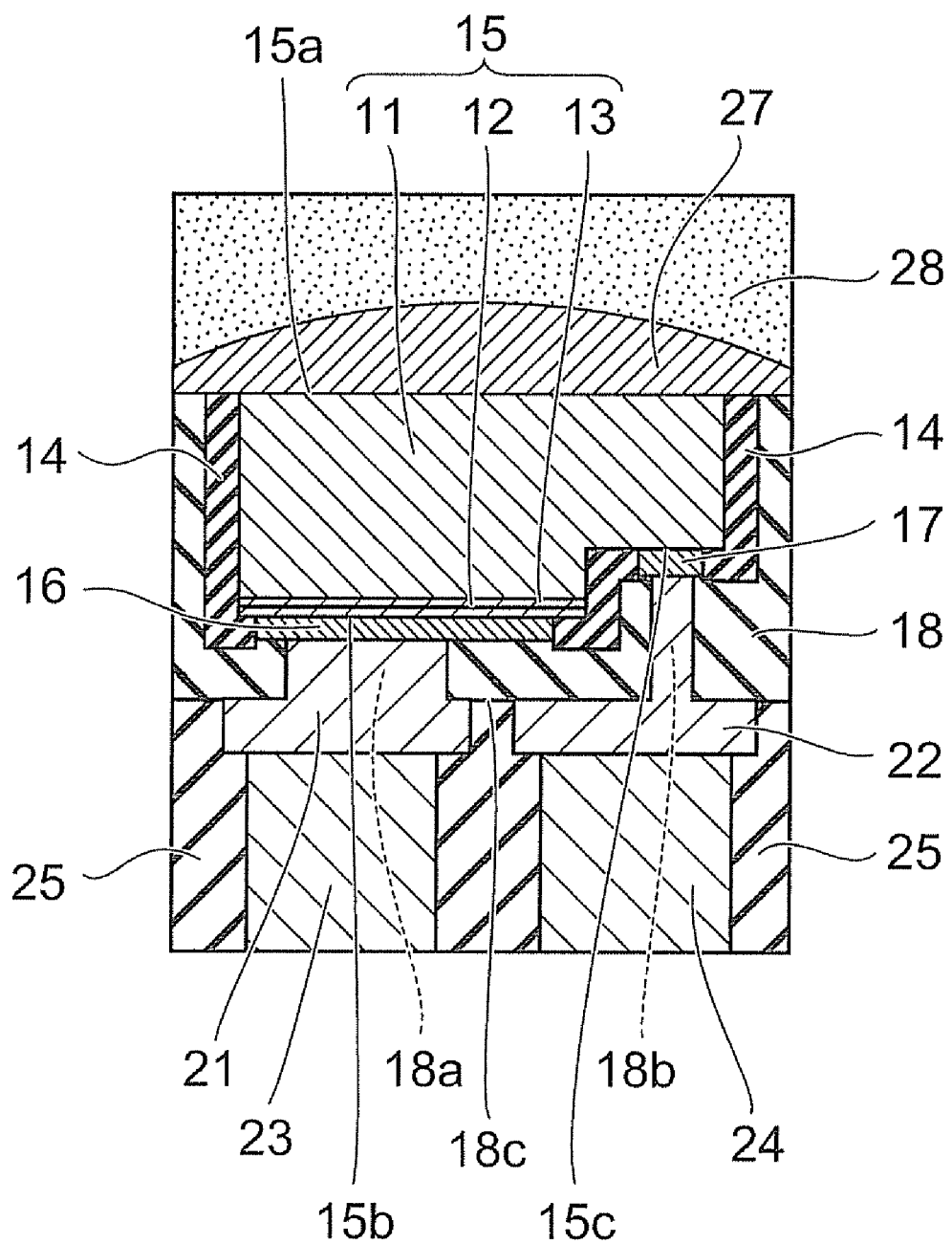
FIG. 1 is a schematic cross-sectional view illustrating a semiconductor light emitting device of a first embodiment.

According to one embodiment, a method for manufacturing a semiconductor light emitting device is disclosed. The method can include forming a first interconnect layer, a second interconnect layer, a first metal pillar, a second metal pillar, a second insulating layer, a transparent material and a phosphor layer. The first interconnect layer is formed in a first opening provided in a first insulating layer included in a stacked body. The stacked body includes a substrate, a plurality of semiconductor layers separated by a separation trench on the substrate, a first electrode, a second electrode and the first insulating layer. Each of the semiconductor layers includes a first major surface, a second major surface opposite to the first major surface and a light emitting layer. The first electrode is provided on a region including the light emitting layer on the second major surface opposite to the substrate, and the second electrode is provided on the second major surface. The first insulating layer is provided on the second major surface side and includes the first opening communicating with the first electrode and a second opening communicating with the second electrode. The second interconnect layer is formed in the second opening in the first insulating layer. The first metal pillar is formed on a face of the first interconnect layer opposite to the first electrode. The second metal pillar is formed on a face of the second interconnect layer opposite to the second electrode. The second insulating layer is formed between a side face of the first metal pillar and a side face of the second metal pillar. The transparent material is formed on the first major surface of a semiconductor layer selected from the plurality of semiconductor layers on the basis of an emission spectrum of a light obtained from the first major surface side. The transparent material transmits the light. The phosphor layer is formed on the transparent material and the first major surface of the plurality of the semiconductor layers.

Embodiments will now be described with reference to the drawings. In the drawings, similar components are marked with the same reference numerals. A partial region in a wafer state is illustrated in the drawings showing manufacturing processes.

FIG. 1 is a schematic cross-sectional view illustrating a semiconductor light emitting device of a first embodiment.

The semiconductor light emitting device of the embodiment includes a semiconductor layer 15. The semiconductor layer 15 includes a first major surface 15a and a second major surface opposite to the first major surface 15a. Electrodes, interconnect layers and a resin layer are provided on the second major surface side. Light is mainly extracted from the first major surface 15a.

The semiconductor layer 15 includes a first semiconductor layer 11 and a second semiconductor layer 13. The first semiconductor layer 11 is, for example, an n type GaN layer functioning as a lateral current path. However, the conductivity type of the first semiconductor layer 11 is not limited to the n-type; and the conductivity type may be a p-type. The second semiconductor layer 13 includes a stacked structure interposing a light emitting layer (an active layer) 12 between an n type layer and a p type layer.

The second major surface side of the semiconductor layer 15 is patterned into a recessed and protruding configuration. A light emitting region 15b and an non-light emitting region 15c are provided on the second major surface side. The light emitting region 15b includes the light emitting layer 12. The non-light emitting region 15c does not include the light emitting layer 12. The non-light emitting region 15c is provided outside a periphery (an edge) of the light emitting layer 12.

A p-side electrode 16 is provided on the surface of the second semiconductor layer 13 (the surface of the light emitting region 15b) as a first electrode. That is, the p-side electrode 16 is provided on the light emitting region 15b including the light emitting layer 12. An n-side electrode 17 is provided the surface of the first semiconductor layer 11 (the surface of the non-light emitting region 15c) as a second electrode. In one chip, i.e. the semiconductor layer 15, an area of the light emitting region 15b is greater than an area of the non-light emitting region 15c, and the p-side electrode 16 has a greater area than the n-side electrode 17. Thus the light emitting region can be increased.

A side surface of the semiconductor layer 15 and part of the second major surface are covered with insulating layers 14 and 18. The insulating layers 14 and 18 are also formed on a step portion between the p-side electrode 16 and the n-side electrode 17. The insulating layer 14 includes, for example, silicon dioxide or silicon nitride. The insulating layer 18 includes, for example, a resin such as a polyimide or the like, which is superior in patterning a fine opening. Alternatively, the insulating layer 18 may be also based on silicon oxide. The insulating layer 14 does not cover the p-side electrode 16 and the n-side electrode 17.

A p-side interconnect layer 21 is provided as a first interconnect layer on a surface 18c of the insulating layer 18 opposite to the first semiconductor layer 15. An n-side interconnect layer 22 is provided as a second interconnect layer on the surface 18c of the insulating layer 18. The p-side interconnect layer 21 is provided also in a first opening 18a, which communicates with the p-side electrode 16 through the insulating layer 18, and the p-side interconnect layer 21 is connected to the p-side electrode 16. The n-side interconnect layer 22 is provided also in a second opening 18b, which communicates with the n-side electrode 17 through the insulating layer 18, and the n-side interconnect layer 22 is connected to the n-side electrode 17.

A p-side metal pillar 23 is provided as the first metal pillar on a face of the p-side interconnect layer 21 opposite to the p-side electrode 16. An n-side metal pillar 24 is provided as a second metal pillar on a face of the n-side interconnect layer 22 opposite to the n-side electrode 17.

A resin layer 25 as a second insulating layer covers the periphery of the p-side metal pillar 23, the periphery of the n-side metal pillar 24, the p-side interconnect layer 21, and the n-side interconnect layer 22. A gap between the neighboring pillars is filled with the resin layer 25. Each end face of the p-side metal pillar 23 and the n-side metal pillar 24 is exposed from the resin layer 25. The second insulating layer may be made of the same material as the first insulating layer (the insulating layer 18).

In the interconnect layer 22 connected to the n-side electrode 17 provided on the non-light emitting region 15c not including the light emitting layer 12 of the semiconductor layer 15, the face opposite to the n-side electrode 17 is formed greater than the face of the n-side electrode 17 side. That is, a contact area between the n-side interconnect layer 22 and the n-side metal pillar 24 is greater than a contact area between the n-side interconnect layer 22 and the n-side electrode 17. A contact area between the p-side interconnect layer 21 and the p-side metal pillar 23 is greater than a contact area between the p-side interconnect layer 21 and the p-side electrode 16. Alternatively the contact area between the p-side interconnect layer 21 and the p-side metal pillar 23 may be smaller than a contact area between the p-side interconnect layer 21 and the p-side electrode 16. A portion of the n-side interconnect layer 22 extends on the surface 18c of the insulating layer 18 to a position facing the light emitting layer 12.

Thereby, an enlarged extracted electrode can be formed from the n-side electrode 17 provided on a small area of the portion not including the light emitting layer 12 of the semiconductor layer 15, via the n-side interconnect layer 22, while keeping a high light output with the larger light emitting layer 12.

The first semiconductor layer 11 is electrically connected to the n-side metal pillar 24 via the n-side interconnect layer 22 and the n-side electrode 17. The second semiconductor layer 13 is electrically connected to the p-side metal pillar 23 via the p-side electrode 16 and the p-side interconnect layer 21.

A surface treatment film (for example, an electroless plating film such as Ni or Au, pre-coated solder or the like) may be formed on each lower face of the p-side metal pillar 23 and the n-side metal pillar 24, so as to avoid rusting.

The materials of the n-side interconnect layer 22, the p-side interconnect layer 21, the n-side metal pillar 24 and the p-side metal pillar 23 may include copper, gold, nickel, silver, etc. Among these materials, it may be preferable to use copper having good thermal conductivity, high resistance for migration and superior adhesion to insulating materials.

Patterning the plurality of fine openings 18a and 18b is performed on the insulating layer 18. It may be preferable for the insulating layer 18 to use, for example, a resin such as a polyimide having excellent patternability.

It may be preferable to use a resin capable to be formed as a thick layer with low cost and suitable for reinforcing the n-side metal pillar 24 and the p-side metal pillar 23. Examples of such a resin layer 25 may include epoxy resin, silicone resin, fluorine resin, etc.

A transparent resin 27 may be provided on the first major surface 15a of the semiconductor layer 15, as a transparent material which transmits the light from the light emitting layer 12. As described hereinbelow, the transparent resin 27 may be omitted.

A phosphor layer 28 is provided on the transparent resin 27. The phosphor layer 28 includes phosphor particles. The phosphor particles are capable of absorbing light from the light emitting layer 12 and emitting wavelength-converted light. Therefore, it is possible to externally emit mixed light containing the light from the light emitting layer 12 and the wavelength-converted light from the phosphor layer 28. In the case where, for example, the light emitting layer 12 is nitride-based, it is possible to obtain white light, lamp light, etc., as mixed-color light of blue light from the light emitting layer 12 and yellow light from, for example, wavelength-converted light of the phosphor layer 28. The phosphor layer 28 may include multiple types of phosphors (e.g., a red phosphor and a green phosphor).

The yellow phosphor particle, the red phosphor particle and the green phosphor particle emit the yellow light, the red light and the green light, respectively, by the excitation light from the light emitting layer 12.

The light emitted from the light emitting layer 12 mainly propagates through the first semiconductor layer 11, the first major surface 15a, the transparent resin 27 and the phosphor layer 28 to be emitted externally.

The transparent resin 27 may be provided on the first major surface 15a, on the basis of the emission spectrum of the light emitted from the light emitting layer 12 and obtained from the first major surface 15a side. The transparent resin 27 may be omitted depending on the emission spectrum. If the transparent resin 27 is provided, the thickness of the transparent resin 27 is adjusted on the basis of the emission spectrum.

A top face of the phosphor layer 28 is planarized. Thus, a thickness of the phosphor layer 28 may vary depending on the thickness of the transparent resin 27 (including zero in thickness without the transparent resin 27). In other words, when a supply amount of the phosphor layer 28 is constant, the thickness of the transparent resin 27 increase with decreasing the thickness of the phosphor layer 28.

In the embodiment, on the basis of the emission spectrum of the light obtained from the first major surface 15a side, it may be determined whether the transparent resin 27 is provided or not, and the thickness of the transparent resin 27 is adjusted, if the resin is provided. For example, a chromaticity variation in the wafer plane is calculated from the measured emission spectrum. The wafer includes the plurality of semiconductor layers 15. The thickness of the phosphor layer 28 is controlled on the basis of the chromaticity variation in the wafer plane. Thereby, a color variation of an externally emitted light can be suppressed by properly adjusting the thickness of the phosphor layer 28 with respect to the chromaticity variation. It may be noted that, even if the emission wavelength of the light emitting layer 12 is the same, the proper thickness of the phosphor layer 28 may vary depending on a kind of the phosphor layer 28.

The transparent resin 27 formed in a convex shape or a concave shape can also function as a lens which controls light distribution characteristics.

The lower faces of the p-side metal pillar 23 and the n-side metal pillar 24 may be bonded to circuit formed on a mounting board or a circuit board via ball-shaped or bump-shaped external terminals such as, for example, solder or other metals. Thereby, the semiconductor light emitting device may receive an electrical power.

Each thickness of the n-side metal pillar 24 and the p-side metal pillar 23 (the thickness in the vertical direction of FIG. 1) is thicker than the thickness of the stacked body including the semiconductor layer 15, the n-side electrode 17, the p-side electrode 16, the insulating layers 14 and 18, the n-side interconnect layer 22, and the p-side interconnect layer 21. The aspect ratios (the ratio of the thickness to the planar size) of the metal pillars 23 and 24 are not limited to being 1 or more, and the aspect ratios may be less than 1. In other words, the thickness of the metal pillars 23 and 24 may be thinner than the planar sizes thereof.

According to the structure of the embodiment, even if the semiconductor layer 15 is thin, it is possible to keep the mechanical strength by forming the n-side metal pillar 24, the p-side metal pillar 23 and the resin layer 25 to be thick. In the case where the semiconductor light emitting device is mounted on the mounting board, the n-side metal pillar 24 and the p-side metal pillar 23 can absorb and mitigate the stress applied to the semiconductor layer 15 via the external terminals.

A method for manufacturing the semiconductor light emitting device of the embodiment will now be described with reference to FIG. 2A to FIG. 5B.

Figure 2A:
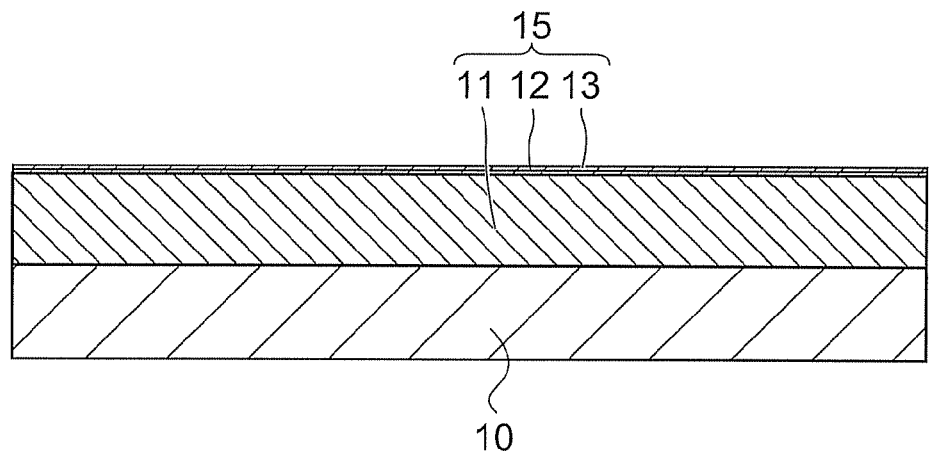
FIG. 2A to FIG. 5B are schematic cross-sectional views illustrating a method for manufacturing the semiconductor light emitting device of the first embodiment.

As illustrated in FIG. 2A, the first semiconductor layer 11 is formed on the major surface of a substrate 10. Then, the second semiconductor layer 13 including the light emitting layer 12 is formed on the first semiconductor layer 11. In the case where the semiconductor layer 15 including the first semiconductor layer 11 and the second semiconductor layer 13 is, for example, made of nitride semiconductors, the semiconductor layer 15 may be formed by, for example, crystal growth on a sapphire substrate.

Figure 2B:
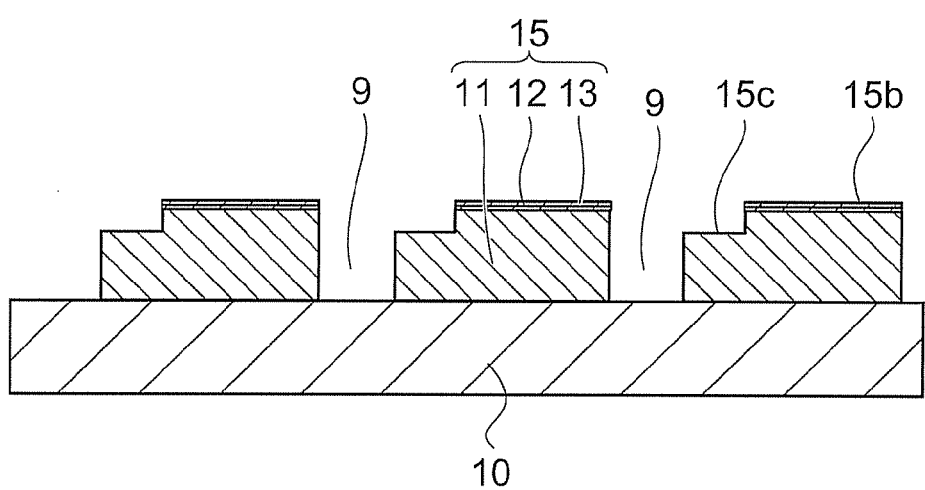

Then, as illustrated in FIG. 2B, a separating trench 9 is formed to pierce the semiconductor layer 15 and reach the substrate 10 by, for example, Reactive Ion Etching (RIE) using a not-illustrated resist as a mask. The separating trench 9 is formed, for example, in a lattice configuration on the substrate 10 with wafer state to multiply-separate the semiconductor layer 15.

Then, a portion of the second semiconductor layer 13 including the light emitting layer 12 is removed by, for example, RIE using the not-illustrated resist to expose a portion of the first semiconductor layer 11. Thereby, the light emitting region 15b is formed on the second major surface side of the semiconductor layer 15 and positioned relatively in the upper level as viewed from the substrate 10. And the non-light emitting region 15c is formed on the second major surface side of the semiconductor layer 15 and positioned more in the lower level on the substrate 10 side than the light emitting region 15b. The light emitting region 15b includes the light emitting layer 12, and the non-light emitting region 15c does not include the light emitting layer 12.

Figure 2C:
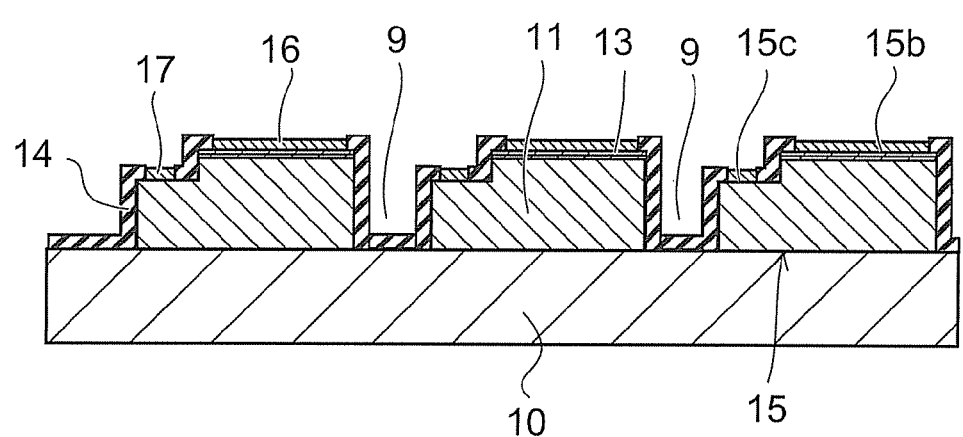

The insulating film 14 shown in FIG. 2C covers the major surface of the substrate 10, the side face and the second major surface of the semiconductor layer 15. Then, after selectively removing the insulating layer 14, the p-side electrode 16 is formed on a surface of the light emitting region 15b (the surface of the second semiconductor layer 13), and the n-side electrode 17 is formed on a surface of the non-light emitting region 15c (the surface of the first semiconductor layer 11). One of the p-side electrode 16 and the n-side electrode 17 can be formed prior to the other, and alternatively the p-side electrode 16 and n-side electrode 17 may be formed simultaneously with the same material.

Figure 3A:
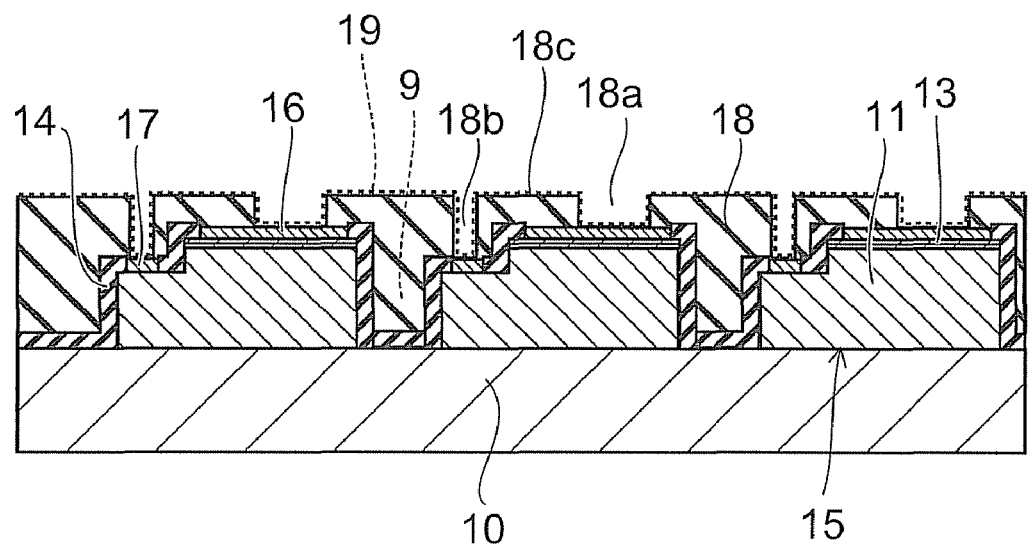

The insulating layer 18 shown in FIG. 3A covers all exposed surfaces on the substrate 10. Then, the insulating layer 18 is patterned by, for example, wet etching to form the first opening 18a and the second opening 18b selectively in the insulating layer 18. The first opening 18a reaches the p-side electrode 16, and the second opening 18b reaches the n-side electrode 17. The separating trench 9 is filled with the insulating layer 18.

Then, as shown by a dot line in FIG. 3A, a continuous seed metal 19 is formed on the surface 18c of the insulating layer 18 and on the inner faces of the first opening 18a and the second opening 18b. After selectively forming a not-illustrated plating resist, Cu plating is performed using the seed metal 19 as a current path.

Figure 3B:
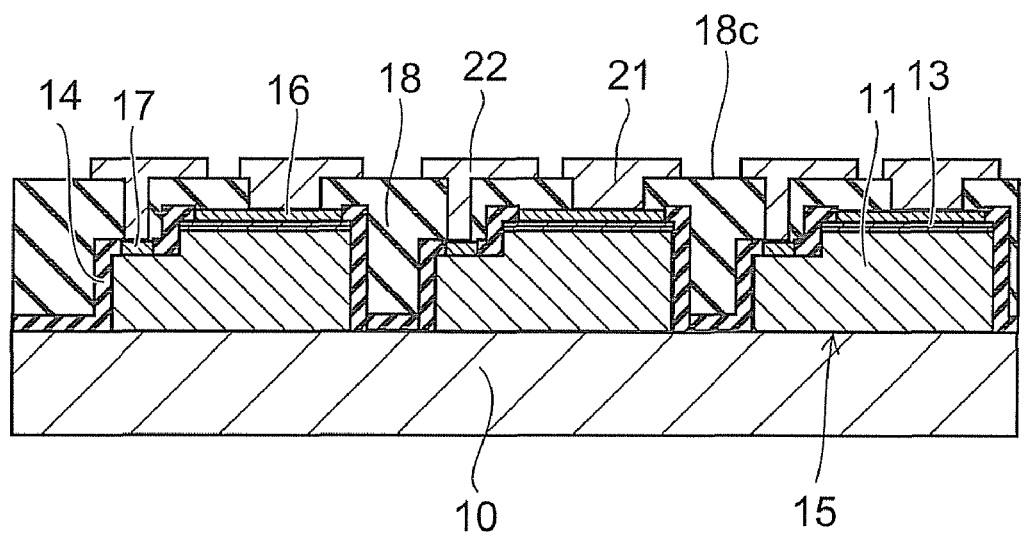

Thereby, as illustrated in FIG. 3B, the p-side interconnect layer 21 and the n-side interconnect layer 22 are formed selectively on the surface 18c of the insulating layer 18. The p-side interconnect layer 21 is formed also in the first opening 18a and connected to the p-side electrode 16. The n-side interconnect layer 22 is formed also in the second opening 18b and connected to the n-side electrode 17. The p-side interconnect layer 21 and the n-side interconnect layer 22 are formed simultaneously with Cu material by plating. Alternatively, one of the p-side interconnect layer 21 and the n-side interconnect layer 22 are not limited to be formed simultaneously and can be formed prior to the other.

The face of the n-side interconnect layer 22 on the side opposite to the n-side electrode 17 is formed into a pad shape greater than the face on the side connecting to the n-side electrode 17. Similarly, the face of the p-side interconnect layer 21 on the side opposite to the p-side electrode 16 is formed into the pad shape greater than the face on the side connecting to the p-side electrode 16.

Subsequently, another plating resist (not illustrated) is formed selectively on the insulating layer 18 for making the metal pillars, and Cu plating is performed using the seed metal 19 described above as a current path.

Figure 4A:
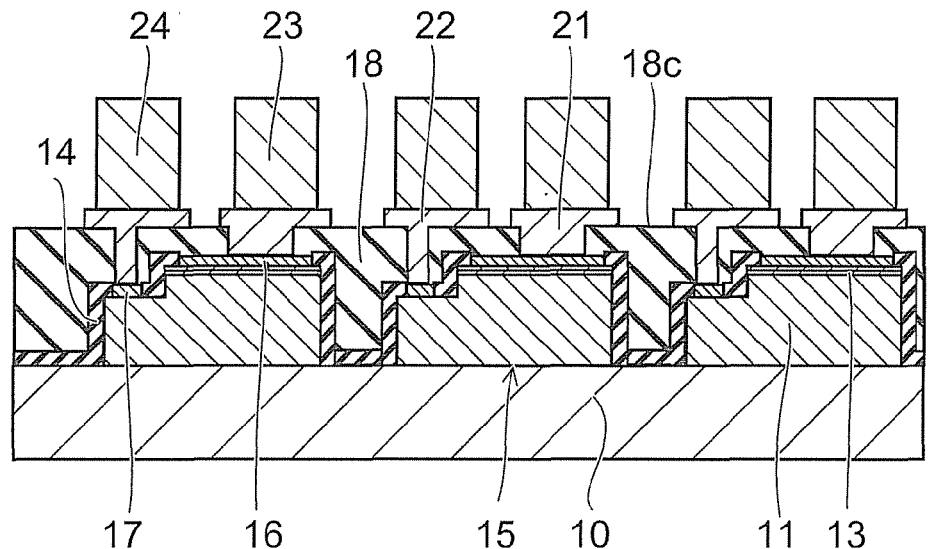

Thereby, as illustrated in FIG. 4A, the p-side metal pillar 23 is formed on the p-side interconnect layer 21, and the n-side metal pillar 24 is formed on the n-side interconnect layer 22. The p-side metal pillar 23 and the n-side metal pillar 24 are formed simultaneously by plating and are made of, for example, Cu material. Alternatively, the p-side metal pillar 23 and the n-side metal pillar 24 are not limited to be formed simultaneously and one of the p-side metal pillar 23 and the n-side metal pillar 24 may be formed prior to the other.

After this plating, using the p-side interconnect layer 21, the n-side interconnect layer 22, the p-side metal pillar 23 and the n-side metal pillar 24 as a mask, the seed metal 19 exposed on the surface 18c of the insulating layer 18 is wet-etched. Thereby, the electrical connection between the p-side interconnect layer 21 and the n-side interconnect layer 22 via the seed metal 19 is divided.

Figure 4B:
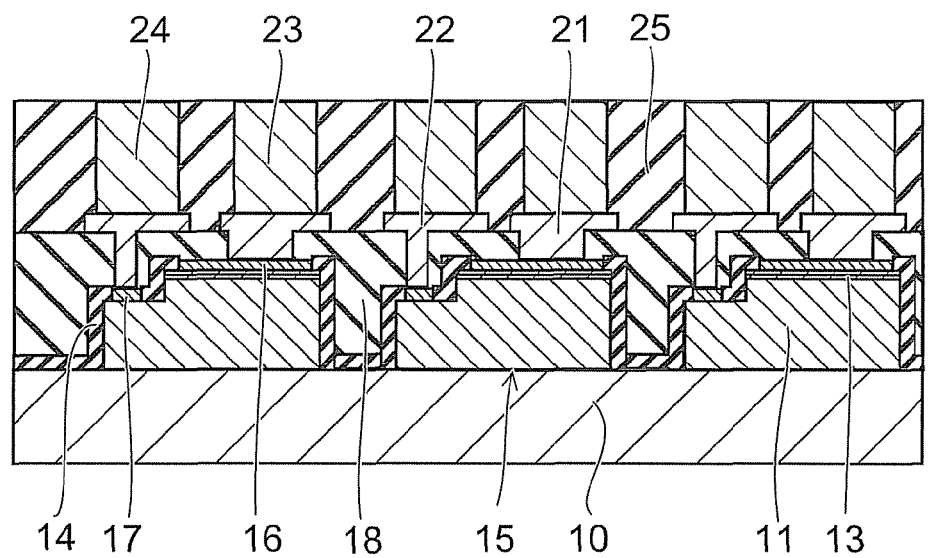

Then, as illustrated in FIG. 4B, the resin layer 25 is formed on the insulating layer 18. The resin layer 25 covers the p-side interconnect layer 21, the n-side interconnect layer 22, the p-side metal pillar 23, and the n-side metal pillar 24. The resin layer 25 is filled in a gap between the p-side metal pillar 23 and the n-side metal pillar 24, and a gap between the p-side interconnect layer 21 and the n-side interconnect layer 22.

Subsequently, the surface of the resin layer 25 is polished to expose the upper faces (the faces on the opposite side of the insulating layer 18) of the p-side metal pillar 24 and the n-side metal pillar 25 from the resin layer 25. In alternative, after forming the phosphor layer 28 described below, the surface of the resin layer 25 may be polished to expose the upper faces of the p-side metal pillar 23 and the n-side metal pillar 24.

Subsequently, the substrate 10 is removed. The substrate 10 is removed, for example, by using laser lift-off method. Specifically, laser light is irradiated from the backside of the substrate 10 toward the first semiconductor layer 11. The substrate 10 transmits the laser light; and the laser light has a wavelength in the absorption region with respect to the first semiconductor layer 11.

When the laser light reaches the interface between the substrate 10 and the first semiconductor layer 11, the first semiconductor layer 11 proximal to the interface absorbs the energy of the laser light and decomposes. In the case where the first semiconductor layer 11 is made of a metal nitride (for example, GaN), the first semiconductor layer 11 decomposes into Ga and nitrogen gas. A micro gap is formed between the substrate 10 and the first semiconductor layer 11 by the decomposition reaction, and the first semiconductor layer 11 is separated from the substrate 10.

The irradiation of the laser light is performed over the entire wafer by performing multiply for each set region, and the substrate 10 is removed. Thereby, extraction efficiency of the emitting light from the semiconductor layer 15 may be improved, owing to the removal of the substrate 10 from the first major surface 15a.

Subsequently, while the light emitting layer 12 is in an active state, the emission spectrum of the light emitted from the first major surface 15a is measured. For example, the ground potential is applied to the first major surface 15a exposed by removal of the substrate 10, and positive bias potential is applied to the exposed face of the p-side metal pillar 23.

When GaN is decomposed by the irradiation with the laser light described above, a Ga film remains on the first major surface 15a and this film may usually reduce the output, so the Ga film is removed. However, in the embodiment, the gallium film is remained during the above measurement and a negative side measurement electrode (probe) is contacted to the gallium film. Thereby, the contact resistance can be reduced more comparing with contacting the probe to GaN.

The voltage described above is applied, and thus holes are injected into the light emitting layer 12 from the second semiconductor side 13, and electrons are injected from the first semiconductor layer side 11. Thereby, the light generated by a recombination of the hole and the electron is emitted from the light emitting layer 12. Then, for example, the emission spectrum of the light emitted from the first major surface 15a is measured.

After measuring the emission spectrum, the first major surface 15a is cleaned and Ga remaining on the first major surface 15a is removed. If necessary, the first major surface 15a may be roughened to improve the extraction efficiency.

Figure 5A:
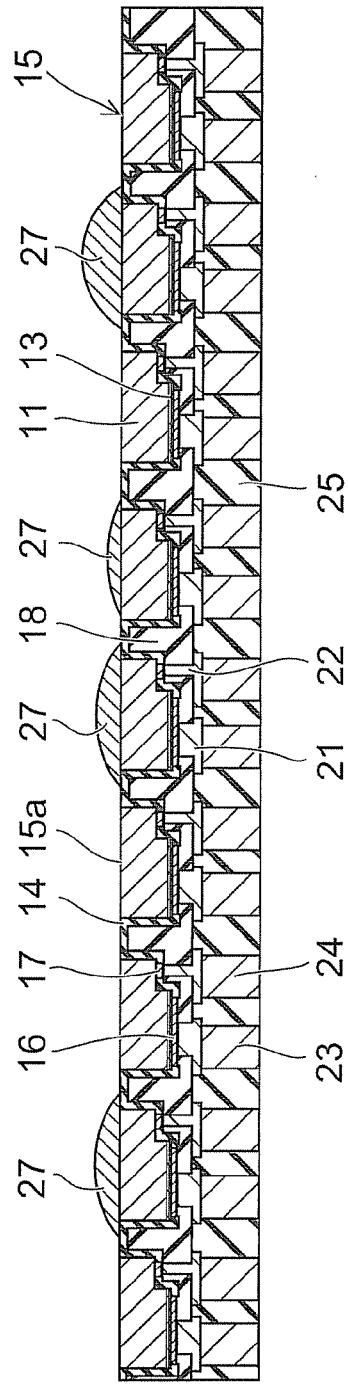

Then, as shown in FIG. 5A, on the basis of the result of the measurement of the emission spectrum, the transparent resin 27 is formed only on the first major surface 15a of the semiconductor layer 15 selected from the all semiconductor layers 15 in a wafer. For example, a liquid resin is provided onto the first major surface 15a by using a dispenser or the like, and then the liquid resin is cured. The amount of the liquid resin provided is adjusted on the basis of the result of the measurement of the emission spectrum, and the thickness of the transparent resin 27 is controlled. Therefore, within the same wafer, a plurality of the transparent resins 27 may be formed with different thickness at a plurality of locations. Alternatively, a plurality of the transparent resins 27 having the same thickness may be formed. It is noted that there may be one wafer without the transparent resin 27 on any semiconductor layers 15 depending on the measurement of the emission spectrum.

Figure 5B:
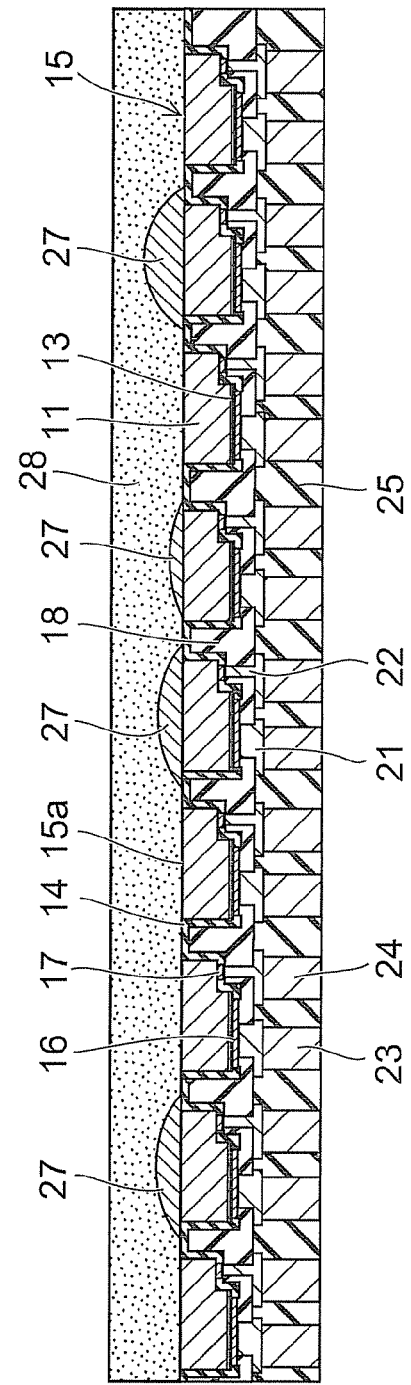

After forming the transparent resin 27, as illustrated in FIG. 5B, the phosphor layer 28 is collectively formed on the first major surface 15a of the all semiconductor layers 15 in the wafer, covering the transparent resin 27. The phosphor layer 28 may be formed, for example, by coating with a liquid transparent resin in which phosphor particles are dispersed using squeegee method, and then curing thermally. The transparent resin is transparent to the emitting light from the light emitting layer 12 and phosphor particles.

The phosphor layer 28 is formed over the entire wafer, for example, by using a spin coating so that the top surface is planar. Thus, the thickness of the phosphor layer 28 above the semiconductor layer 15 with the transparent resin 27 becomes thinner than that above the semiconductor layer 15 without the transparent resin 27. Further the thinner phosphor layer 28 is formed on the thicker transparent resin 27. A distance from the first major surface 15a of the semiconductor layer 15 to the top face of the phosphor layer 28 is almost the same on a portion with the transparent material (the transparent resin 27) and a portion without the transparent material (the transparent resin 27).

In the case of using laser lift-off method described above for separating the substrate 10, as the surface of the semiconductor layer 15 is irradiated with the laser light, the wavelength of the light emitted from the first major surface 15a may vary within the wafer, owing to the irradiation effect. The peak wavelength shift of the excitation light emitted from the first major surface 15a causes a change of the conversion efficiency or the intensity of fluorescent emission in the phosphor layer 28, and may result in variation of the color of the externally emitted light.

Then the chromaticity variation in the wafer plane is calculated on the basis of the result of the measurement of the emission spectrum of the light obtained from the first major surface 15a side of each of the semiconductor layers 15.

In the embodiment, on the basis of the chromaticity variation, whether the transparent resin 27 is provided or not is determined, and the thickness of the transparent resin 27 is adjusted. Thus, the thickness of the phosphor layer 28 is adequately adjusted depending on the chromaticity variation in the wafer plane and the color variation of the externally emitted light can be suppressed.

In place of providing the transparent resin 27, it is also contemplated to adjust an amount of phosphor layer 28 supplied onto the first major surface 15a for locally adjusting the thickness of the phosphor layer 28 on the wafer. However, because the phosphor layer 28 contains the phosphor particles, it is difficult to deliver small amount of the liquid resin including the phosphor particles by drops into a micro area through a dispenser with a micro diameter. The productivity may be reduced.

On the other hand, the transparent resin 27 of the embodiment does not contain phosphor particles. Thus it is possible to selectively supply the transparent resin 27 in a liquid resin form onto the micro area easily. It is possible to reduce a planar size of a chip divided into pieces by reducing a planar size of each of the semiconductor layers 15. Since number of the chips increases within the same wafer owing to the reduced chip size, it is possible to reduce production costs.

Figure 6A:
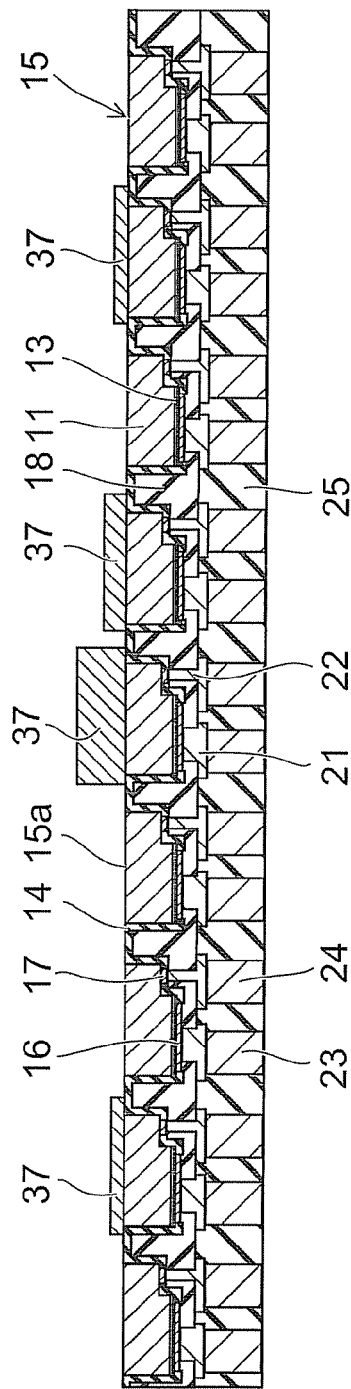
FIG. 6A and FIG. 6B are schematic cross-sectional views illustrating a method for manufacturing a semiconductor light emitting device of a variation of the first embodiment.

The transparent material formed on the first major surface 15a is not limited to the transparent resin 27, and a glass plate 37 may be used as illustrated in FIG. 6A.

On the basis of the measurement result of the emission spectrum of the light obtained from the first major surface 15a side, the glass plate 37 is formed only on the first major surface 15a of the selected semiconductor layer 15 of the all semiconductor layers 15 in the wafer. For example, the glass plate 37 is attached to the first major surface 15a via an adhesive layer. The thickness of the glass plate 37 is controlled on the basis of the measurement result of the emission spectrum.

Figure 6B:
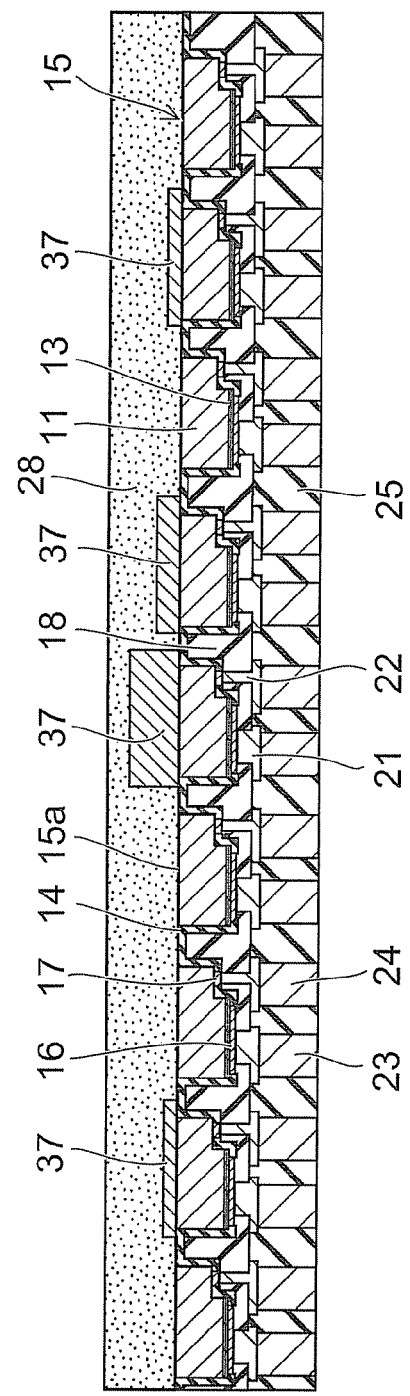

After forming the glass plate 37, as illustrated in FIG. 6B, the phosphor layer 28 is collectively formed on the first major surface 15a of the all semiconductor layers 15 in the whole wafer, covering the glass plate 37. For example, by using the spin coating, the phosphor layer 28 is formed over the entire wafer so that the top surface is planar. Hence, above the semiconductor layer 15 with the glass plate 37, the thickness of the phosphor layer 28 is thinner than that above the semiconductor layer 15 without the glass plate 37. Further the thinner phosphor layer 28 is formed on the thicker glass plate 37.

Then the chromaticity variation in the wafer plane is calculated on the basis of the result of the measurement of the emission spectrum of the light obtained from the first major surface 15a side of each of the semiconductor layers 15.

As well in the embodiment, on the basis of the chromaticity variation, whether the glass plate 37 is provided or not is determined, and the thickness of the glass plate 37 is adjusted. Thus, the thickness of the phosphor layer 28 is adequately adjusted depending on the chromaticity variation in the wafer plane and the color variation of the externally emitted light can be suppressed.

Comparing with the case where the liquid transparent resin 27 is delivered by drops and cured, the glass plate 37 is easy to be controlled into a desired shape. For example, the glass plate 37 formed in a convex shape or a concave shape can also function as a lens which controls light distribution characteristics.

It may be preferable for the transparent resin 27 or the glass plate 37 to have a value between a refractive index of the semiconductor layer 15 (for example, 2.5 of GaN) and a refractive index of the phosphor layer 28 (for example, about 1.5). If the refractive index difference is small at the interface between the semiconductor layer 15 and the transparent material (i.e., the transparent resin 27, the glass plate 37) and at the interface between the transparent material and the phosphor later 28, transmittance of light increases.

After forming the phosphor layer 28, dicing is performed along the separating trench 9 (FIG. 2B) to singulate. At the dicing, the substrate 10 is already removed. The separating trench 9 does not contain a part of the semiconductor layer 15. Furthermore, separating trench 9 is filled with a resin as the insulating layer 18. Thus, the dicing may be easily performed and the productivity can be improved. Furthermore, damage to the semiconductor layer 15 can be avoided during the dicing. Thereby, the device structure is obtained after singulation, in which the side faces of the semiconductor layer 15 are covered with the insulating layer 18 and protected.

The singulated semiconductor light emitting device may have a single-chip structure including one semiconductor layer 15 or a multi-chip structure including multiple semiconductor layers 15.

If the transparent resin 27 is supplied collectively to the region including the multiple semiconductor layers 15 in the wafer state, the transparent resin 27 is supplied also to the dicing region between the multiple semiconductor layers 15. If the dicing region is cut in a state such that the transparent resin 27 is formed on the dicing region, this may cause the blue light not passing through the phosphor layer to emit in the vicinity of the chip edge. Therefore, the transparent resin 27 may be preferably supplied in each semiconductor layer 15. It is noted that in the multi-chip structure, the transparent resin 27 may be supplied collectively to the region including the multiple semiconductor layers.

Because the processes described above up to the dicing are performed collectively in the wafer state, it is unnecessary to perform re-interconnecting electrodes and packaging for each of the singulated semiconductor light emitting devices, and it is possible to drastically reduce production costs. The re-interconnecting electrodes and the packaging is already completed in the wafer state. Also, inspections are possible at the wafer level. Therefore, the productivity can be increased, resulting in easy cost reduction.

The transparent material (i.e., the transparent resin 27 or the glass plate 37) may also contain a small amount of phosphor particles. At least one kind of particles selected from the group of red phosphor particles, green phosphor particles and yellow phosphor particles may be contained in the transparent material, and two kinds or all of them may be contained.

For example, in the case where white light is emitted by using the red phosphor particles and the green phosphor particles, only thickness control of the phosphor layer 28 leads to increase or decrease of two kinds of phosphor particles, both the red and green phosphor particles.

In contrast, by using the transparent material containing only a small amount of the red phosphor particles or only a small amount of the green phosphor particles, precise color adjustment can be performed.

FIG. 7A to FIG. 8B illustrate a method for manufacturing a semiconductor light emitting device of a second embodiment.

Figure 7A:
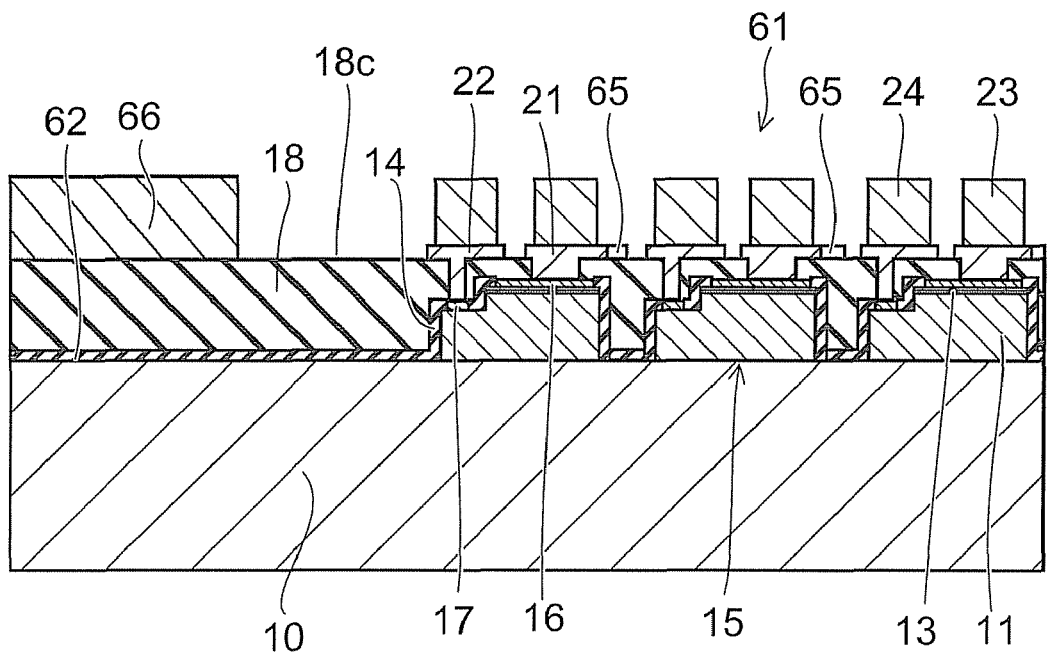
FIG. 7A to FIG. 8B are schematic cross-sectional views illustrating a method for manufacturing a semiconductor light emitting device of a second embodiment.
Figure 7B:
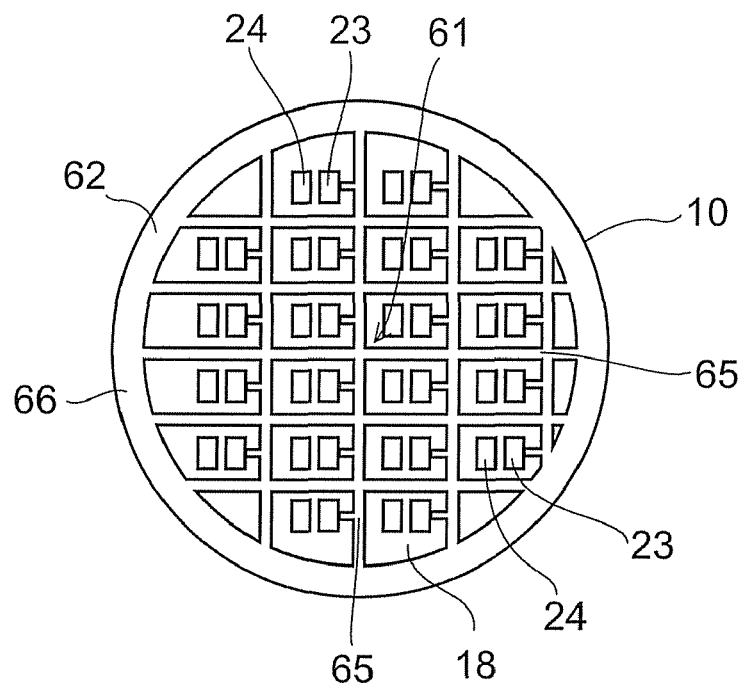
Figure 8A:
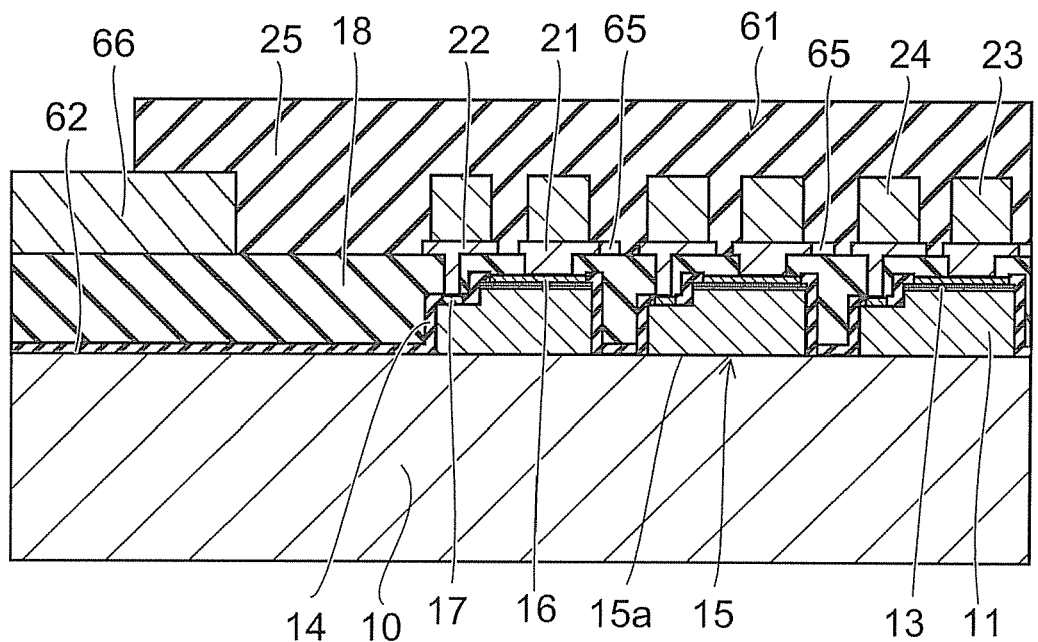
Figure 8B:
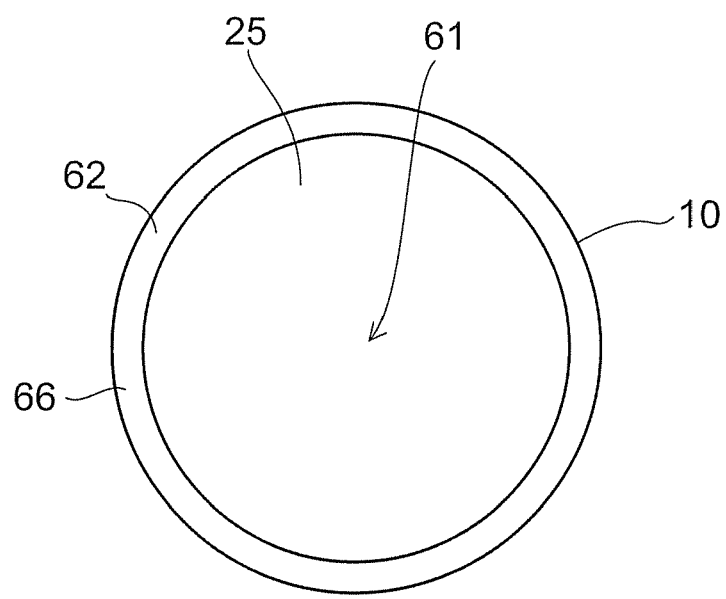

The substrate 10 includes a device region 61, where a plurality of the semiconductor layers 15 are formed, and an outer circumferential region 62 outside the device region 61. FIG. 7A and FIG. 8A illustrate partial cross-sections of a region near to the outer circumferential region 62. FIG. 7B illustrates a plan view of the entire wafer corresponding to FIG. 7A. FIG. 8B illustrates a plan view of the entire wafer corresponding to FIG. 8A.

In the embodiment, during the plating of the p-side interconnect layer 21 and the n-side interconnect layer 22, an inside interconnection 65 and an outer circumferential interconnection 66 are also simultaneously formed on the surface 18c of the insulating layer 18.

The inside interconnection 65 is formed in the dicing region including the separation trench 9 in the device region 61, for example, in a lattice configuration. The outer circumferential interconnection 66 is formed on the surface 18c of the insulating layer 18 located in the outer circumferential region 62. The outer circumferential interconnection 66 is continuously formed along a circumferential direction of the outer circumferential region 62, and encloses the device region 61 with the continuous closed pattern.

The inside interconnection 65 is integrally connected to part of the p-side interconnect layer 21. Furthermore, end portions of the inside interconnection 65 on the outer circumferential region 62 side are integrally connected to the outer circumferential interconnection 66. Hence, the p-side interconnect layer 21 is electrically connected to the outer circumferential interconnection 66 via the inside interconnection 65. The n-side interconnect layer 22 is not connected to any one of the p-side interconnect layer 21, the inside interconnection 65 and the outer circumferential interconnection 66.

Furthermore, during the plating of the p-side pillar 23 and n-side pillar 24, the metal is also plated on the outer circumferential interconnection 66. During this plating, the inside interconnection 65 is covered with a resist in order to avoid the metal plating, whereby the p-side metal pillar 23 is not provided over the inside interconnection 65. Hence, the outer circumferential interconnection 66 becomes thicker than the inside interconnection 65. The thickness of the outer circumferential interconnection 66, the total thickness of the p-side interconnect layer 21 and p-side metal pillar 23, and the total thickness of the n-side interconnect layer 22 and the n-side metal pillar 24 are almost the same. Because the relatively thick metal layer is continuously formed in the circumferential direction on the outer circumferential region 62 of the wafer, the mechanical strength of the wafer is increased and warp in the wafer is suppressed. Thereby, the following processes are easily performed.

As illustrated in FIG. 8A and FIG. 8B, the resin layer 25 is formed on the wafer, except for part of the outer circumferential interconnection 66 exposed from the resin layer 25 at the outer circumferential side.

Then, after exposing the first major surface 15a by removing the substrate 10, in order to emit the light from the light emitting layer 12, the voltage is applied between the first major surface 15a and the exposed portion of the outer circumferential interconnection 66 on the outer circumferential side. The emission spectrum of the light emitted from the first major surface 15a is measured.

The outer circumferential interconnection 66 is connected to the p-side interconnect layer 21 via the inside interconnection 65 described above. Thus, by applying the above voltage, holes from the second semiconductor layer side and electrons from the first semiconductor layer side are injected into the light emitting layer 12. Thereby the light generated by recombination of the hole and the electron is emitted from the light emitting layer 12. The emission spectrum of the light emitted from the first major surface 15a is measured.

In the embodiment, as described above, by forming the outer circumferential interconnection 66 connected to the p-side interconnect layer 21 on the outer circumferential region 62, it becomes possible to apply the voltage to the p-side interconnect layer 21 via the outer circumferential interconnection 66, even if the p-side metal pillar 23 is covered with the resin layer 25. Thereby, while ensuring the wafer strength by the relatively thick resin layer 25, the emission spectrum measurement can be performed and productivity decline can be avoided.

Subsequently, similar to the embodiment described above, the substrate 10 is removed and the phosphor layer 28 is formed. After this the wafer is diced at the separation trench 9 into the chips. The inside interconnection 65 described above is formed on the dicing region and the dicing width is almost the same as the width of the inside interconnection 65 or wider than the width of the inside interconnection 65. In this case, the diced chip is formed not to include the inside interconnection 65. Furthermore, since the p-side interconnect layer 21 is cut at the portion connected to the inside interconnection 65, a part of the end face of the p-side interconnect layer 21 is exposed from the resin layer 25 or the insulating layer 18 on the side surface of the chip. Thereby, the p-side interconnect layer 21 can be distinct from the n-side interconnect layer 22 in which all end faces are covered with the resin layer 25 also after singulation.

When the diced semiconductor light emitting device is mounted on the mounting board, the lower faces of the p-side metal pillar 23 and the n-side metal pillar 24 exposed from the resin layer 25 are necessary to be bonded to circuits provided on the mounting board in response to respective polarities. Thus each of the p-side metal pillar 23 and the n-side metal pillar is necessary to be distinguished from the other. However, the side surfaces of the metal pillars are covered with the resin layer 25 and only the lower faces are exposed. Therefore, when downsized, it is difficult to distinguish between both pillars.

In the embodiment, the end face of the part of the p-side interconnect layer 21 provided below the p-side metal pillar 23 is exposed from the resin layer 25 on the side surface of the chip. In contrast, the end face of the n-side interconnect layer 22 provided below the n-side metal pillar 24 is wholly covered with the resin layer 25 and not exposed. Therefore, by recognizing the end face exposed to the side surface of the resin layer 25, it can be easily distinguished which metal pillar is the p-side or the n-side. As a result, the mounting becomes easy, the productivity is increased and the production cost can be reduced.

Next, a third embodiment will be described.

Figure 9:
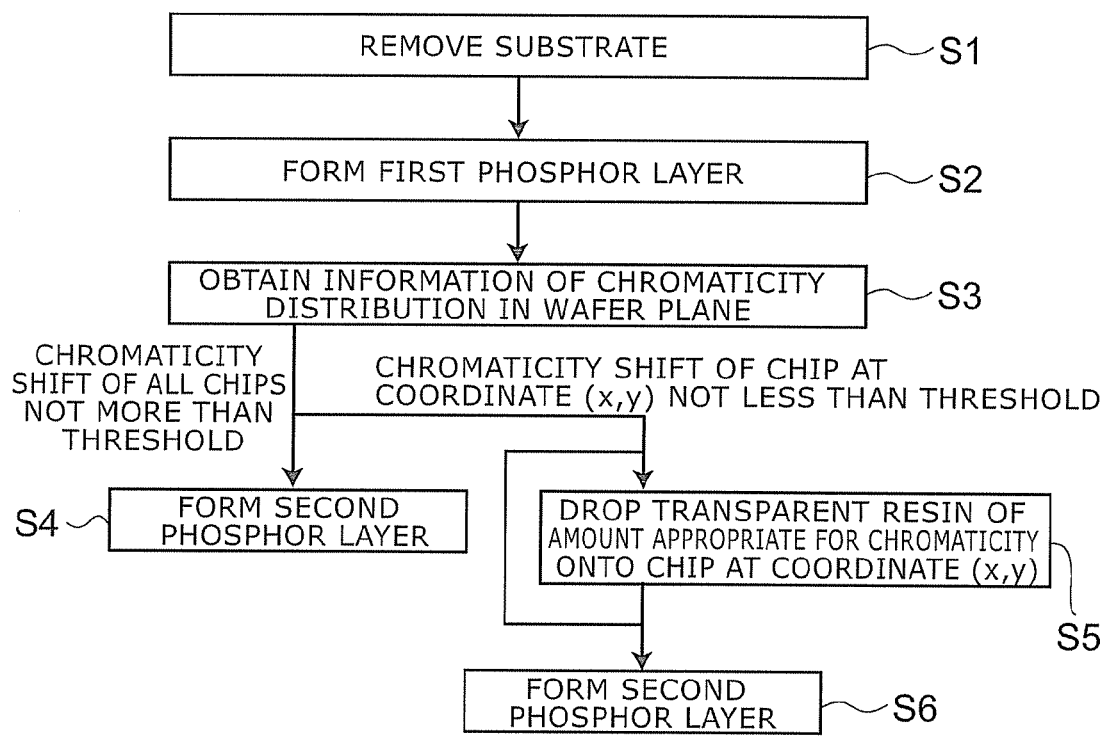
FIG. 9 is a flow chart illustrating a method for manufacturing a semiconductor light emitting device of a third embodiment.

FIG. 9 shows a flow chart after the process of removing the substrate 10 in a method for manufacturing a semiconductor light emitting device of the third embodiment.

Figure 10A:
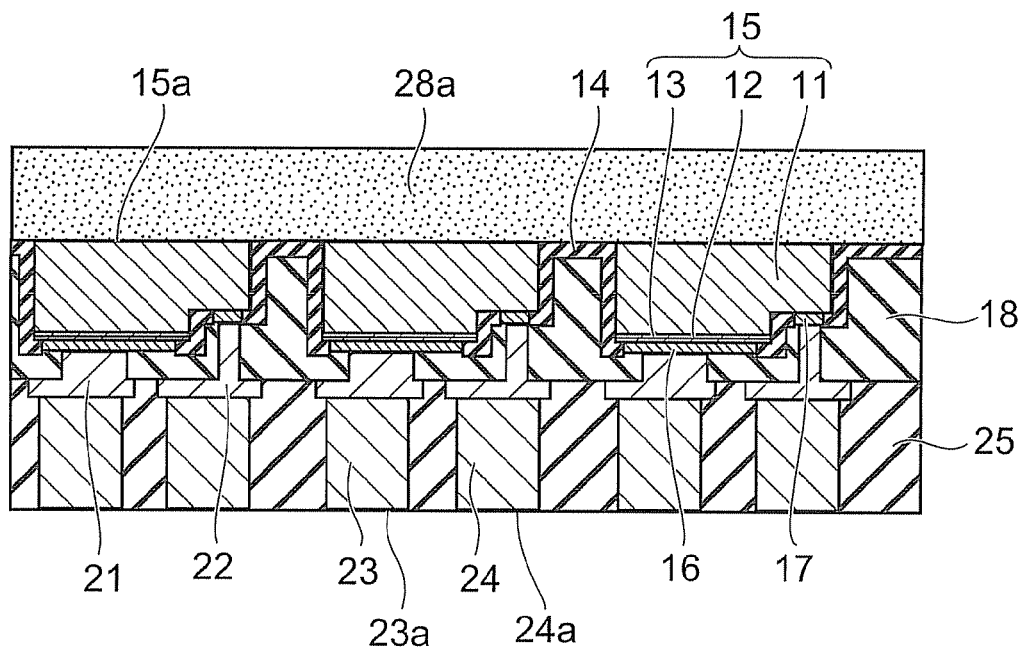
FIGS. 10A and 10B are schematic cross-sectional views illustrating the method for manufacturing the semiconductor light emitting device of the third embodiment.
Figure 10B:
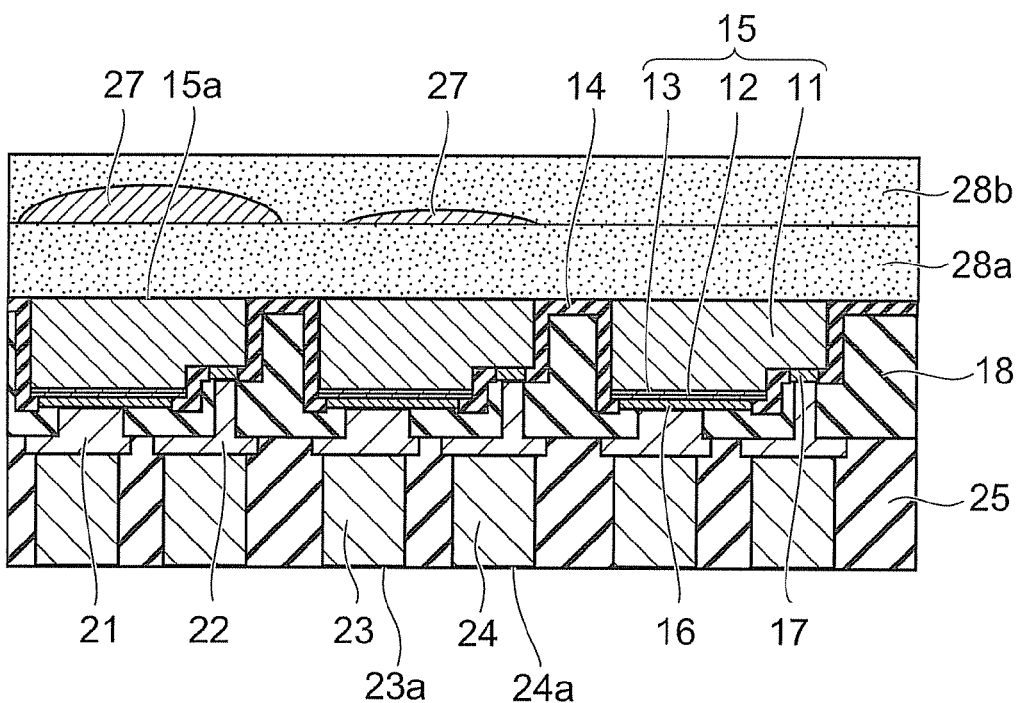

FIGS. 10A and 10B are schematic cross-sectional views illustrating the method for manufacturing a semiconductor light emitting device of the third embodiment.

As well as the embodiment described above, the semiconductor layer 15, the p-side electrode 16, the n-side electrode 17, the insulating layers 14 and 18, the p-side interconnect layer 21, the n-side interconnect layer 22, the p-side metal pillar 23, the n-side metal pillar 24 and the resin layer 25 are formed on the substrate 10. Subsequently, as well as the embodiment described above, the substrate 10 is removed (step S1).

Next, as shown in FIG. 10A, a first phosphor layer 28a is formed on the first major surface 15a of the semiconductor layer 15 exposed by removal of the substrate 10 (step S2).

The first phosphor layer 28a is formed collectively on the region containing the all semiconductor layer 15 in the wafer. The first phosphor layer 28a is formed on the first major surface 15a of the respective semiconductor layers 15 and the dicing region.

The process of forming the first phosphor layer 28a, for example, includes the process of applying the liquid transparent resin in which phosphor particles are dispersed and then the process of curing thermally the liquid transparent resin. The transparent resin is transparent to the emitting light from the light emitting layer 12 and the phosphor particles.

The first phosphor layer 28a is formed over the entire wafer, for example, by using a vacuum squeegee printing method so that the top surface is planar. The thickness of the first phosphor layer 28a is generally uniform in the wafer plane.

Next, the resin layer 25 is polished to expose an external terminal 23a of the p-side metal pillar 23 and an external terminal 24a of the n-side metal pillar 24. The external terminals 23a and 24a are mounted to the mounting board via a solder or the like. The external terminals 23a and 24a may be exposed before the removal of the substrate 10.

Next, information of chromaticity distribution in the wafer plane is obtained (step S3).

Specifically, the light emitting layer 12 is in an active state, and the emission spectrum of the light emitted from the first major surface 15a is measured for each chip (semiconductor layer 15). The light obtained from the first phosphor layer 28a side is, for example, mixed light including the light of the emitting layer 12 and the light of the first phosphor layer 28a excited by the light of the emitting layer 12. The information of chromaticity distribution in the wafer plane is obtained from the measured emission spectrum. The emission spectrum of all chips may be measured. Alternatively, the emission spectrum of the only selected chip may be measured.

A probe of a wafer prober is contacted to the external terminals 23a and 24a, and a current is supplied to the emitting layer 12 through the external terminals 23a and 24a, and then the light is emitted from the emitting layer 12. Because the external terminals 23a and 24a to which the probe is contacted are exposed on the same side of the wafer, the normal wafer prober can be used for the measurement. The first major surface 15a of the semiconductor layer 15 is protected by the first phosphor layer 28a and the probe does not contact to the first major surface 15a. Therefore, the damage of the semiconductor layer 15 can be avoided during the measurement of the emission spectrum.

On the basis of the aforementioned information of the chromaticity distribution in the wafer plane, as shown in FIG. 10B, the transparent resin 27 is formed only on the first phosphor layer 28a on the first major surface 15a of the semiconductor layer 15 selected from all semiconductor layers 15 in the wafer.

For example, after the liquid transparent resin 27 is supplied onto the first phosphor layer 28a using dispenser or the like, the resin is cured. On the basis of the aforementioned information of the chromaticity distribution in the wafer plane, the supply amount of the liquid resin is adjusted, and the thickness of the transparent resin 27 is controlled. Therefore, within the same wafer, a plurality of the transparent resins 27 may be formed with different thickness at a plurality of locations. Alternatively, a plurality of the transparent resins 27 having the same thickness may be formed on one wafer. It is noted that there may be one wafer without the transparent resin 27 on any semiconductor layers 15 depending on the measurement of the emission spectrum.

In the case where the chromaticity shift of all chips (semiconductor layers 15) in the wafer is not more than the threshold from the aforementioned information of the chromaticity distribution in the wafer plane, step S4 is proceeded in FIG. 9.

More specifically, without forming the transparent resin 27 on any chips, a second phosphor layer 28b is formed on the first phosphor layer 28a. The process of forming the second phosphor layer 28b, for example, includes the process of applying the liquid transparent resin in which phosphor particles are dispersed and then the process of curing thermally the liquid transparent resin. The transparent resin is transparent to the light from the first phosphor layer 28a side.

The second phosphor layer 28b is formed over the entire wafer, for example, by using a vacuum squeegee printing method so that the top surface is planar. If the transparent resin 27 is not formed in the wafer plane, the thickness of the second phosphor layer 28b is generally uniform in the wafer plane.

In the case where the chromaticity shift of the chip at coordination (x, y) is not less than the threshold from the aforementioned information of the chromaticity distribution in the wafer plane, step S5 is proceeded in FIG. 9.

More specifically, the transparent resin 27 of the amount (thickness) in accordance with the chromaticity obtained by measuring the aforementioned emission spectrum is supplied onto the chip at the coordination (x, y). The transparent resin of the amount (thickness) in accordance with the chromaticity is supplied to the all chips with chromaticity shift not less than the threshold.

After supplying the transparent resin 27 onto all target chips, as shown in step S6 in FIG. 10B, the second phosphor layer 28b is supplied. The second phosphor layer 28b is formed on the first phosphor layer 28a so as to cover the transparent resin 27.

The second phosphor layer 28b is formed over the entire wafer, for example, by using the vacuum squeegee printing method so that the top surface is planar. Thus, the thickness of the second phosphor layer 28b above the semiconductor layer 15 with the transparent resin 27 becomes thinner than that above the semiconductor layer 15 without the transparent resin 27. Further the thinner phosphor layer 28b is formed on the thicker transparent resin 27.

A distance from the first major surface 15a of the semiconductor layer 15 to the top face of the second phosphor layer 28b is almost the same on a portion with the transparent resin 27 and a portion without the transparent resin 27.

The chromaticity variation in the wafer plane is calculated on the basis of the result of the measurement of the emission spectrum of the light obtained from the first phosphor layer 28a side.

Then, on the basis of the chromaticity variation, whether the transparent resin 27 is provided or not is determined, and the thickness of the transparent resin 27 is adjusted. Thus, the thickness of the phosphor layer 28 is adequately adjusted depending on the chromaticity variation in the wafer plane and the color variation of the externally emitted light can be suppressed.

Figure 11:
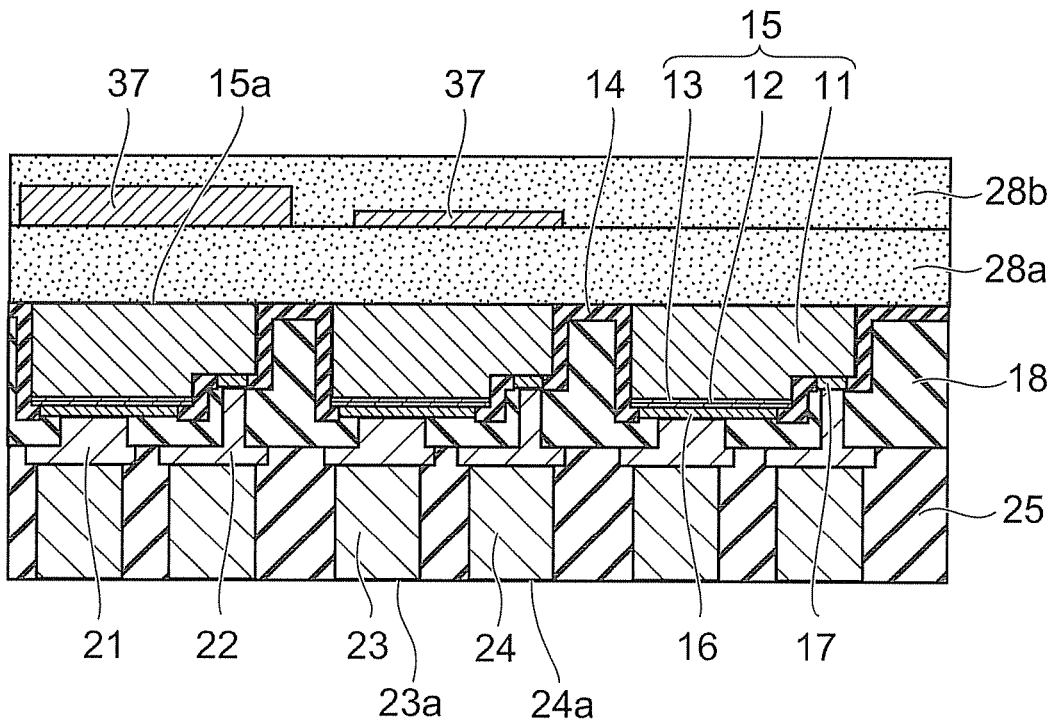
FIG. 11 is a schematic cross-sectional view illustrating a method for manufacturing a semiconductor light emitting device of a variation of the third embodiment.

As well in the embodiment, the transparent material is not limited to the transparent resin 27, but may be the glass plate 37 as shown in FIG. 11.

In other word, on the basis of the information of the chromaticity distribution in the wafer plane, the glass plate 37 is formed only on the first phosphor layer 28a on the first major surface 15a of the semiconductor layer 15 selected from the semiconductor layers 15 in the wafer. For example, the glass plate 37 is attached to the first major surface 15a via an adhesive layer. The thickness of the glass plate 37 is controlled on the basis of the information of the chromaticity distribution in the wafer plane.

After forming the glass plate 37, the second phosphor layer 28b is formed on the first phosphor layer 28a so as to cover the glass plate 37. The second phosphor layer 28b is formed, for example, by using the vacuum squeegee printing method so that the top surface is planar. Thus, the thickness of the second phosphor layer 28b above the semiconductor layer 15 with the glass plate 37 becomes thinner than that above the semiconductor layer 15 without the glass plate 37. Further the thinner phosphor layer 28b is formed on the thicker glass plate 37. The distance from the first major surface 15a of the semiconductor layer 15 to the top face of the second phosphor layer 28b is almost the same on a portion with the glass plate 37 and a portion without the glass plate 37.

As well in the embodiment, on the basis of the chromaticity, whether the glass plate 37 is provided or not is determined, and the thickness of the glass plate 37 is adjusted, if the glass plate 37 is provided. Thus, the thickness of the phosphor layer is adequately adjusted depending on the chromaticity and the color variation of the externally emitted light can be suppressed.

Thickness of each of the first phosphor layer 28a and the second phosphor layer 28b and concentrations of phosphor particles contained in the respective is set so that a target chromaticity can be obtained. The concentration of the phosphor particles in the first phosphor layer 28a and the concentration of the phosphor particles in the second phosphor layer 28b may be either same or different.

Figure 12:
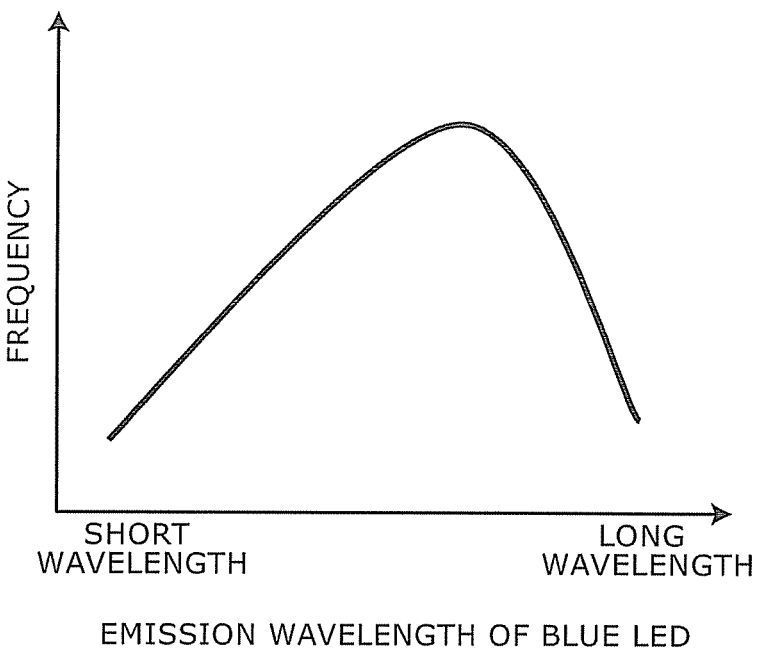
FIG. 12 shows an distribution of emission wavelength of a blue LED in a wafer plane.

Here, FIG. 12 shows one example of the emission wavelength distribution in the wafer plane of an LED chip (semiconductor layer 15) based on a GaN-based material emitting light in a blue spectral region. The horizontal axis represents the emission wavelength and the wavelength becomes longer rightward. The vertical axis represents the frequency.

With respect to such a distribution in the wafer plane of the emission wavelength of the blue LED, the center value of the phosphor particle concentration in the phosphor layer and the center value of the film thickness are set as assuming that a short wavelength side of the emission wavelength is the center value, or a central wavelength is the center value, or a long wavelength side is the center value.

For example, absorptance of excitation light in red phosphor particles and green phosphor particles decreases with decreasing emission wavelength of the blue LED toward the long wavelength side.

Thus, in the case where the center value of the wavelength of the blue LED is set to the short wavelength side, with regard to the phosphor layer including the red phosphor particles and the green phosphor particles, a correction is made such that the phosphor particles concentration is increased on the center value side or the film thickness is increased on the center value side.

In the case where the center value of the wavelength of the blue LED is set to the long wavelength side, with regard to the phosphor layer including the red phosphor particles and the green phosphor particles, a correction is made such that the phosphor particles concentration is decreased on the center value side or the film thickness is decreased on the center value side. That is, because the absorptances of the red phosphor particles and the green phosphor particles increase with short emission wavelength of the excitation light from the blue LED, in the case where the center value of the emission wavelength of the blue LED is set to the long wavelength side, chromaticity correction is made by increasing relatively the amount of the transparent resin and decreasing the amount of the phosphor layer.

If the kind of the phosphor particles included in the first phosphor layer 28a is made same as the kind of the phosphor particles included in the second phosphor layer 28b, the chromaticity shift after forming the first phosphor layer 28a becomes easy to be corrected by the second phosphor layer 28b. It may be preferable that different kinds of phosphor particles are not included in the first phosphor layer 28a and the second phosphor layer 28b.

For example, if the first phosphor layer 28a includes yellow phosphor particles, the second phosphor layer 28b including the same kind of yellow phosphor particles as the first phosphor layer 28a is used. Alternatively, if the first phosphor layer 28a includes the red phosphor particles and the green phosphor particles, the second phosphor layer 28b including the same kinds of red phosphor particles and green phosphor particles as the first phosphor layer 28a is used.

If the phosphor particles concentration is low, chromaticity sensitivity due to variation of the film thickness of the phosphor layer decreases. The target chromaticity depends on total amount of the phosphor particles. Thus, if the phosphor particles concentration is too low, the film thickness is too thick in order to ensure the necessary total amount of the phosphor particles, and light distribution and package figure may be influenced.

Therefore, it may be preferable that the first phosphor layer 28a has a film thickness thinner than the second phosphor layer 28b and includes high concentration phosphor particles than the second phosphor layer 28b. Conversely, it is preferable that the second phosphor layer 28b has a film thickness thicker than the first phosphor layer 28a and includes low concentration phosphor particles than the first phosphor layer 28a. After forming the second phosphor layer 28b, the film thickness variation of the second phosphor layer 28b itself and the film thickness variation of the transparent material (transparent resin 27, glass plate 37) may occur. Thus, it may be preferable that the second phosphor layer 28b has a phosphor particles concentration lower than the first phosphor layer 28a and then variation of the phosphor particles amount due to variation of the film thickness is suppressed.

The green phosphor particles have different sensitivity to the emission wavelength the blue LED from the red phosphor particles. The green phosphor particles have greater sensitivity than the red phosphor particles with respect to the emission wavelength shift of the blue LED. Therefore, the variation of the film thickness and the dispersion variation of the phosphor particles or the like in the first phosphor layer 28a may cause the large chromaticity variation due to the green phosphor particles.

Therefore, the chromaticity shift due to the green phosphor particles can be suppressed by lowering the relative concentration of the green phosphor particles to the red phosphor particles in the first phosphor layer 28b than that in the second phosphor layer 28b, furthermore by interfusing the transparent material (transparent resin 27, glass plate 37) with a small amount of green phosphor particles.

The phosphor layer 28, the first phosphor layer 28a and the second phosphor layer 28b may include examples of the layers described below, such as a red phosphor layer, a yellow phosphor layer, a green phosphor layer and a blue phosphor layer.

The red phosphor layer may contain, for example, a nitride-based phosphor of $CaAlSiN_3:Eu$ or a SiAlON-based phosphor.

In the case where a SiAlON-based phosphor is used, it may be used

$$(M_{1-x}R_x)_{a1}AlSi_{b1}O_{c1}N_{d1} \quad \text{Compositional Formula (1)}$$

where M is at least one type of metal elements excluding Si and Al, and it may be desirable for M to be at least one selected from Ca and Sr; R is a light emission center element, and it may be desirable for R to be Eu; and x, a1, b1, c1, and d1 satisfy following relationships $0<x\leq 1$, $0.6<a1<0.95$, $2<b1<3.9$, $0.25<c1<0.45$, and $4<d1<5.7$.

By using the SiAlON-based phosphor represented by compositional formula (1), temperature characteristics of the wavelength conversion efficiency can be improved, and the efficiency in the high current density region can be improved further.

The yellow phosphor layer may contain, for example, a silicate-based phosphor of $(Sr, Ca, Ba)_2SiO_4:Eu$.

The green phosphor layer may contain, for example, a halophosphate-based phosphor of $(Ba, Ca, Mg)_{10}(PO_4)_6Cl_2:Eu$ or a SiAlON-based phosphor.

In the case where a SiAlON-based phosphor is used, it may be used

$$(M_{1-x}R_x)_{a2}AlSi_{b2}O_{c2}N_{d2} \quad \text{Compositional Formula (2)}$$

where M is at least one type of metal elements excluding Si and Al, and it may be desirable for M to be at least one selected from Ca and Sr; R is a light emission center element, and it may be desirable for R to be Eu; and x, a2, b2, c2, and d2 satisfy following relationships $0<x\leq1$, $0.93<a2<1.3$, $4.0<b2<5.8$, $0.6<c2<1$, and $6<d2<11$.

By using the SiAlON-based phosphor of compositional formula (2), temperature characteristics of the wavelength conversion efficiency can be improved, and the efficiency in the high current density region can be improved further.

The blue phosphor layer may contain, for example, an oxide-based phosphor of $BaMgAl_{10}O_{17}:Eu$.

According to one embodiment, a semiconductor light emitting device comprising:
a plurality of semiconductor layers, each of the semiconductor layers including a first major surface, a second major surface opposite to the first major surface and a light emitting layer;
a first electrode provided on a region including the light emitting layer on the second major surface side;
a second electrode provided on the second major surface;
a first insulating layer provided on the second major surface side of the semiconductor layer and including a first opening communicating with the first electrode and a second opening communicating with the second electrode;
a first interconnect layer provided in the first opening and connected to the first electrode;
a second interconnect layer provided in the second opening and connected to the second electrode;
a first metal pillar provided on a face of the first interconnect layer opposite to the first electrode;
a second metal pillar provided on a face of the second interconnect layer opposite to the second electrode;
a second insulating layer provided between a side face of the first metal pillar and a side face of the second metal pillar;
a transparent material provided on the first major surface of a semiconductor layer selected from the plurality of the semiconductor layers, the transparent material transmitting light obtained from the first major surface side; and
a phosphor layer provided on the first major surface of each of the plurality of the semiconductor layers and covering the transparent material.

According to one embodiment, the transparent material includes a transparent resin.

According to one embodiment, the transparent material includes a glass plate.

According to one embodiment, an top face of the phosphor layer is flat, and a thickness of the phosphor layer of a portion provided with the transparent material is thinner than a thickness of the phosphor layer of a portion not provided with the transparent material.

According to one embodiment, a plurality of the transparent material having different thickness are provided on the plurality of the semiconductor layers.

According to one embodiment, an area of the first electrode is greater than an area of the second electrode.

According to one embodiment, a contact area between the second interconnect layer and the second metal pillar is greater than a contact area between the second interconnect layer and the second electrode.

According to one embodiment, a contact area between the first interconnect layer and the first metal pillar is greater than a contact area between the first interconnect layer and the first electrode.

According to one embodiment, a portion of the second interconnect layer extends on the first insulating layer to a position facing the light emitting layer.

According to one embodiment, each of the first metal pillar and the second metal pillar is thicker than a stacked body including the semiconductor layer, the first electrode, the second electrode, the first insulating layer, the first interconnect layer and the second interconnect layer.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the invention.

The invention claimed is:

1. A method for manufacturing a semiconductor light emitting device, comprising:
forming a first interconnect layer in a first opening provided in a first insulating layer included in a stacked body, the stacked body including:
a substrate;
a plurality of semiconductor layers separated by a separation trench on the substrate, each of the semiconductor layers including a first major surface, a second major surface opposite to the first major surface and a light emitting layer;
a first electrode provided on a region including the light emitting layer on the second major surface opposite to the substrate;
a second electrode provided on the second major surface; and
the first insulating layer provided on the second major surface side and including the first opening communicating with the first electrode and a second opening communicating with the second electrode;
forming a second interconnect layer in the second opening in the first insulating layer;
forming a first metal pillar on a face of the first interconnect layer opposite to the first electrode;
forming a second metal pillar on a face of the second interconnect layer opposite to the second electrode;
forming a second insulating layer between a side face of the first metal pillar and a side face of the second metal pillar;
forming a transparent material on the first major surface of a semiconductor layer selected from the plurality of semiconductor layers on the basis of an emission spectrum of a light obtained from the first major surface side, the transparent material transmitting the light; and
forming a phosphor layer on the transparent material and the first major surface of the plurality of the semiconductor layers.

2. The method of claim 1, wherein the phosphor layer having a flat top face is formed.

3. The method of claim 1, further comprising calculating a chromaticity variation in a wafer plane, the wafer including the plurality of semiconductor layers,
the transparent material being formed on the basis of the chromaticity variation.

4. The method of claim 1, wherein the transparent material is formed thicker on a portion with the relatively thinner phosphor layer.

5. The method of claim 1, wherein a distance from the first major surface of the semiconductor layer to an top face of the phosphor layer is generally the same on a portion with the transparent material and on a portion without the transparent material.

6. The method of claim 1, further comprising, before the forming the transparent material, applying a voltage between the first major surface exposed by removing the substrate and the first interconnect layer to emit light from the light emitting layer; and measuring the emission spectrum of the light emitted from the first major surface.

7. The method of claim 1, wherein the forming the transparent material includes supplying a liquid transparent resin on the first major surface, and curing the supplied liquid resin.

8. The method of claim 7, wherein an amount of the transparent resin is adjusted on the basis of the emission spectrum.

9. A method for manufacturing a semiconductor light emitting device, comprising:
   forming a first interconnect layer in a first opening provided in a first insulating layer included in a stacked body, the stacked body including:
      a substrate;
      a plurality of semiconductor layers separated by a separation trench on the substrate, each of the semiconductor layers including a first major surface, a second major surface opposite to the first major surface and a light emitting layer;
      a first electrode provided on a region including the light emitting layer on the second major surface opposite to the substrate;
      a second electrode provided on the second major surface; and
      the first insulating layer provided on the second major surface side and including the first opening communicating with the first electrode and a second opening communicating with the second electrode;
   forming a second interconnect layer in the second opening in the first insulating layer;
   forming a first metal pillar on a face of the first interconnect layer opposite to the first electrode;
   forming a second metal pillar on a face of the second interconnect layer opposite to the second electrode;
   forming a second insulating layer between a side face of the first metal pillar and a side face of the second metal pillar;
   forming a first phosphor layer on the first major surface;
   forming a transparent material on the first phosphor layer on a semiconductor layer selected from the plurality of semiconductor layers on the basis of an emission spectrum of a light obtained from the first phosphor layer side, the transparent material transmitting the light; and
   forming a second phosphor layer on the transparent material and the first phosphor layer.

10. The method of claim 9, wherein the first phosphor layer includes phosphor particles being same as phosphor particles included in the second phosphor layer.

11. The method of claim 9, wherein the first phosphor layer and the second phosphor layer are formed so that each of top surfaces is planar.

12. The method of claim 9, wherein the transparent material is formed thicker on a portion where the second phosphor layer is relatively thinner.

13. The method of claim 9, wherein a distance from the first major surface of the semiconductor layer to a top surface of the second phosphor layer is generally the same on a portion with the transparent material and a portion without the transparent material.

14. The method of claim 9, further comprising: after the forming the first phosphor layer and before the forming the transparent material, applying a voltage between a face of the first metal pillar opposite to the first interconnect layer and a face of the second metal pillar opposite to the second interconnect layer to emit light from the light emitting layer; and measuring the emission spectrum of the light emitted from the first major surface via the first phosphor layer.

15. The method of claim 9, wherein the first phosphor layer has a film thickness thinner than the second phosphor layer, and includes phosphor particles with a high concentration.

16. The method of claim 10, wherein
   the first phosphor layer and the second phosphor layer include red phosphor particles excited by light emitted from the light emitting layer to emit red light and green phosphor particles excited by the light emitted from the light emitting layer to emit green light, and
   the first phosphor layer has a lower relative concentration of the green phosphor particles to the red phosphor particles than the second phosphor layer.

17. The method of claim 16, wherein the transparent material is interfused with the green phosphor particles.

18. The method of claim 9, wherein the forming the transparent material includes
   supplying a liquid transparent resin onto the first phosphor layer, and
   curing the transparent resin supplied onto the first phosphor layer.

19. The method of claim 18, wherein a supply amount of the transparent material is adjusted on the basis of the emission spectrum.

* * * * *